(12) United States Patent
Xu

(10) Patent No.: US 10,348,277 B2
(45) Date of Patent: Jul. 9, 2019

(54) OSCILLATOR WITH INHERENT COMPARATOR DELAY INFLUENCE ELIMINATED

(71) Applicant: Chengdu Monolithic Power Systems Co., Ltd., Chengdu (CN)

(72) Inventor: Li Xu, Chengdu (CN)

(73) Assignee: Chengdu Monolithic Power Systems Co., Ltd., Chengdu (CN)

(*) Notice: Subject to any disclaimer, the term of this patent is extended or adjusted under 35 U.S.C. 154(b) by 250 days.

(21) Appl. No.: 15/387,624

(22) Filed: Dec. 21, 2016

(65) Prior Publication Data

US 2017/0194952 A1 Jul. 6, 2017

(30) Foreign Application Priority Data

Dec. 31, 2015 (CN) .......................... 2015 1 1024703

(51) Int. Cl.
| | |
|---|---|
| *H02M 1/08* | (2006.01) |
| *H03B 5/04* | (2006.01) |
| *H03B 5/24* | (2006.01) |
| *H03K 4/502* | (2006.01) |
| *H03K 3/0231* | (2006.01) |

(52) U.S. Cl.
CPC .............. *H03K 4/502* (2013.01); *H02M 1/08* (2013.01); *H03B 5/04* (2013.01); *H03B 5/24* (2013.01); *H03K 3/0231* (2013.01)

(58) Field of Classification Search
CPC . H02M 2001/0035; H02M 2001/0058; H02M 3/33507; H02M 7/06; H02M 7/217; H02M 1/08; H03B 5/24; H03B 5/04; H03B 5/12; H03K 3/03; H03K 3/0315; H03K 3/354; H03K 4/502; H03K 3/0321; H03L 7/099
USPC ........................... 331/111, 143; 363/98, 132
See application file for complete search history.

(56) References Cited

U.S. PATENT DOCUMENTS

| | | | | |
|---|---|---|---|---|
| 6,867,657 | B2* | 3/2005 | Hollinger | ............... H03K 4/501 331/111 |
| 8,232,846 | B1* | 7/2012 | De Vita | ................. H03K 4/502 331/111 |
| 2012/0086515 | A1* | 4/2012 | Yang | .................... H03K 3/0231 331/111 |
| 2012/0319789 | A1* | 12/2012 | Bhowmik | ............ H03K 3/0231 331/143 |
| 2013/0021109 | A1* | 1/2013 | Niederl | ................ H03K 3/0231 331/111 |

* cited by examiner

*Primary Examiner* — Arnold M Kinkead
(74) *Attorney, Agent, or Firm* — Perkins Coie LLP

(57) ABSTRACT

There is provided an oscillator which includes a current source, a capacitor coupled between the current source and a reference ground, a first switch coupled to the capacitor in parallel, an error amplifier, a comparator and a one-shot circuit. The error amplifier is coupled to the capacitor and configured to generate a regulation voltage based on a reference voltage and the voltage across the capacitor. The comparator is configured to compare the voltage across the capacitor with the regulation voltage and generate a comparison signal. The one-shot circuit is coupled to the comparator, wherein based on the comparison signal, the one-shot circuit generates a trigger signal to control the first switch.

16 Claims, 10 Drawing Sheets

OSCILLATOR WITH INHERENT COMPARATOR DELAY INFLUENCE ELIMINATED

CROSS-REFERENCE TO RELATED APPLICATIONS

This application claims the benefit of CN application 201511024703.9, filed on Dec. 31, 2015, and incorporated herein by reference.

TECHNICAL FIELD

The present invention generally relates to electronic circuits, and more particularly but not exclusively, to oscillators used in electronic apparatuses.

BACKGROUND

In switching power supplies, an oscillator is usually formed by a current source 11, a capacitor C1, a switch S1, a comparator COM1 and a one-shot circuit, connected as shown in FIG. 1. The capacitor C1 is basically charged by the current source 11. The comparator COM1 compares the voltage Vc1 across the capacitor C1 with a reference voltage Vref. Once the voltage Vc1 increases to reach the reference voltage Vref, a pulse will be generated by the one-shot circuit to discharge the capacitor C1 through the switch S1.

Theoretically, the oscillating frequency f of the oscillator is determined by the reference voltage Vref, the current source 11 and the capacitor C1. Nevertheless, owing to an intrinsic delay Td of the comparator COM1, the switch S1 could not be turned on right after the voltage Vc1 hits the reference voltage Vref, as can be seen from FIG. 2. The frequency f could be expressed as:

$$f = \frac{1}{T_{saw} + T_{op}} = \frac{1}{\frac{C_1 * V_{ref}}{I_1} + T_d + T_{op}} \quad (1)$$

Wherein Tsaw indicates the charge time of the capacitor C1, and Top is representative of the width of the pulse generated by the one-shot circuit.

The inherent delay Td is generally affected by temperature, parasitic inductance and etc. And because of this delay, the oscillating frequency f could hardly match its theoretical value, especially for high frequency oscillators with frequency higher than 2.2 MHz.

SUMMARY

Embodiments of the present invention are directed to an oscillator comprising: a current source having a first terminal and a second terminal, wherein the first terminal is coupled to a power supply voltage; a capacitor having a first terminal and a second terminal, wherein the first terminal is coupled to the second terminal of the current source, the second terminal is coupled to a reference ground; a first switch having a first terminal, a second terminal and a control terminal, wherein the first terminal is coupled to the first terminal of the capacitor, the second terminal is coupled to the reference ground; an error amplifier having a first input terminal, a second input terminal and an output terminal, wherein the first input terminal is configured to receive a reference voltage, the second input terminal is coupled to the first terminal of the capacitor, and wherein based on the reference voltage and the voltage across the capacitor, the error amplifier generates a regulation voltage at the output terminal; a comparator having a first input terminal, a second input terminal and an output terminal, wherein the first input terminal is coupled to the first terminal of the capacitor, the second input terminal is coupled to the output terminal of the error amplifier, and wherein the comparator compares the voltage across the capacitor with the regulation voltage, and generates a comparison signal at the output terminal; and a one-shot circuit having an input terminal and an output terminal, wherein the input terminal is coupled to the output terminal of the comparator, the output terminal is coupled to the control terminal of the first switch, and wherein based on the comparison signal, the one-shot circuit generates a trigger signal at the output terminal.

Embodiments of the present invention are also directed to an oscillator comprising: a first current source having a first terminal and a second terminal, wherein the first terminal is coupled to a power supply voltage; a first capacitor having a first terminal and a second terminal, wherein the first terminal is coupled to the second terminal of the first current source, the second terminal is coupled to a reference ground; a first switch having a first terminal, a second terminal and a control terminal, wherein the first terminal is coupled to the first terminal of the first capacitor, the second terminal is coupled to the reference ground; a second current source having a first terminal and a second terminal, wherein the first terminal is coupled to the power supply voltage; a second capacitor having a first terminal and a second terminal, wherein the first terminal is coupled to the second terminal of the second current source, the second terminal is coupled to the reference ground; a second switch having a first terminal, a second terminal and a control terminal, wherein the first terminal is coupled to the first terminal of the second capacitor, the second terminal is coupled to the reference ground; a third switch having a first terminal, a second terminal and a control terminal, wherein the first terminal is coupled to the first terminal of the first capacitor; a fourth switch having a first terminal, a second terminal and a control terminal, wherein the first terminal is coupled to the first terminal of the second capacitor; an error amplifier having a first input terminal, a second input terminal and an output terminal, wherein the first input terminal is configured to receive a reference voltage, the second input terminal is coupled to the second terminals of the third and fourth switches, and the output terminal provides a regulation voltage; a first comparator having a first input terminal, a second input terminal and an output terminal, wherein the first input terminal is coupled to the first terminal of the first capacitor, the second input terminal is coupled to the output terminal of the error amplifier, and wherein the first comparator compares the voltage across the first capacitor with the regulation voltage, and generates a first comparison signal at the output terminal; a second comparator having a first input terminal, a second input terminal and an output terminal, wherein the first input terminal is coupled to the first terminal of the second capacitor, the second input terminal is coupled to the output terminal of the error amplifier, and wherein the second comparator compares the voltage across the second capacitor with the regulation voltage, and generates a second comparison signal at the output terminal; a flip-flop having a first input terminal, a second input terminal, a first output terminal and a second output terminal, wherein the first input terminal is coupled to the output terminal of the first comparator, the second input terminal is coupled to the output terminal of the second comparator, the first output terminal is coupled to the control terminal of the first switch, the second output terminal is coupled to the control terminal of the second switch, wherein based on the first and second comparison signals, the flip-flop generates a first trigger signal and a second trigger signal respectively at the first and second output terminals; a first NOT gate having an input terminal and an output terminal, wherein the input terminal is coupled to the first output terminal of the flip-flop, the output terminal is coupled to the control terminal of the third switch; and a second NOT gate having an input terminal and an output terminal, wherein the input terminal is coupled to the second output terminal of the flip-flop, the output terminal is coupled to the control terminal of the fourth switch.

Embodiments of the present invention are further directed to a controller used in a switching power supply, comprising: an oscillator including: a current source having a first terminal and a second terminal, wherein the first terminal is coupled to a power supply voltage; a capacitor having a first terminal and a second terminal, wherein the first terminal is coupled to the second terminal of the current source, the second terminal is coupled to a reference ground; a first switch having a first terminal, a second terminal and a control terminal, wherein the first terminal is coupled to the first terminal of the capacitor, the second terminal is coupled to the reference ground; an error amplifier having a first input terminal, a second input terminal and an output terminal, wherein the first input terminal is configured to receive a first reference voltage, the second input terminal is coupled to the first terminal of the capacitor, and wherein based on the first reference voltage and the voltage across the capacitor, the error amplifier generates a regulation voltage at the output terminal; a comparator having a first input terminal, a second input terminal and an output terminal, wherein the first input terminal is coupled to the first terminal of the capacitor, the second input terminal is coupled to the output terminal of the error amplifier, and wherein the comparator compares the voltage across the capacitor with the regulation voltage, and generates a comparison signal at the output terminal; and a one-shot circuit having an input terminal and an output terminal, wherein the input terminal is coupled to the output terminal of the comparator, the output terminal is coupled to the control terminal of the first switch, and wherein based on the comparison signal, the one-shot circuit generates a trigger signal at the output terminal; and a control circuit coupled to the oscillator, wherein based on a clock signal generated by the oscillator and a feedback signal indicative of an output signal of the switching power supply, the control circuit generates a control signal to control a main switch in the switching power supply, and wherein the clock signal is either the comparison signal or the trigger signal.

In the embodiments of the present invention, the average value or peak value of the capacitor voltage is regulated to a corresponding reference voltage through an error amplifier. By doing so, the influence on the oscillating frequency, which is caused by the intrinsic delay of the comparator, can be eliminated.

BRIEF DESCRIPTION OF THE DRAWING

The present invention can be further understood with reference to the following detailed description and the appended drawings, wherein like elements are provided with like reference numerals.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

To solve the problem mentioned in the background part, the average value or peak value of the capacitor voltage is sent into an error amplifier and compared with a corresponding reference voltage in accordance with embodiments of the present invention. A regulation voltage generated thereupon is provided to the comparator, and then compared with the voltage across the capacitor to generate the comparison signal which is used to trigger the one-shot circuit. By virtue of regulating the average or peak value of the capacitor voltage, influence on the oscillating frequency, which is caused by the intrinsic delay of the comparator, can be eliminated. Therefore the precision of the oscillator is improved.

Figure 3:
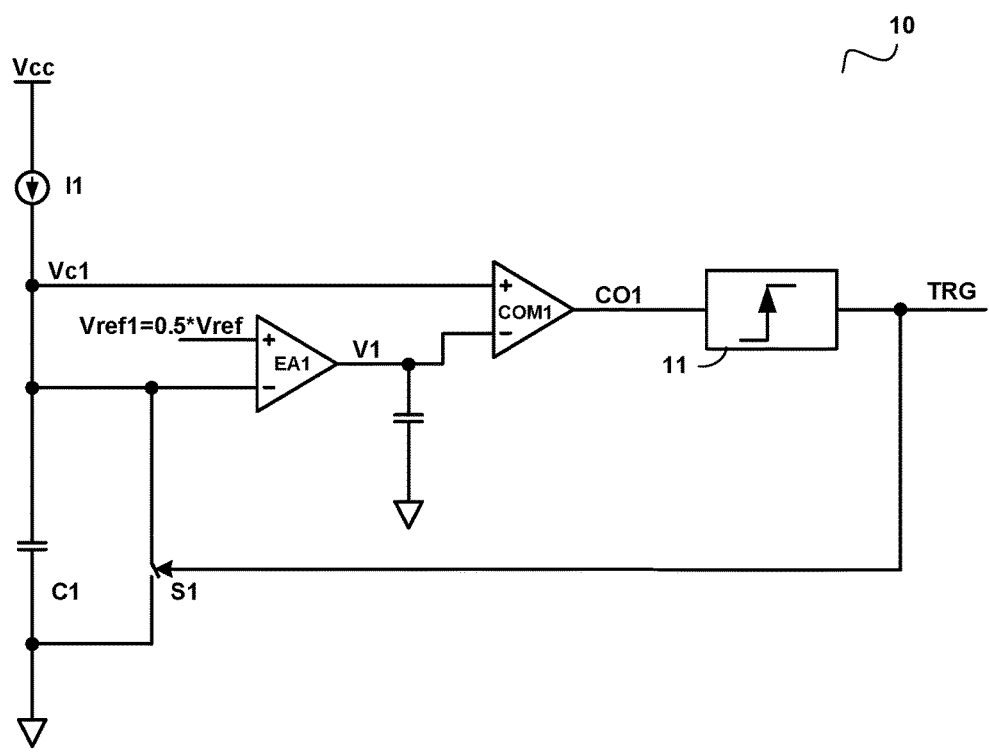
FIG. 3 schematically illustrates an oscillator 10 in accordance with an embodiment of the present invention.

FIG. 3 schematically illustrates an oscillator 10 in accordance with an embodiment of the present invention. The oscillator 10 includes a current source I1, a capacitor C1, a switch S1, an error amplifier EA1, a comparator COM1 and a one-shot circuit 11. The current source I1 has a first terminal and a second terminal, wherein the first terminal is coupled to a power supply voltage Vcc. The capacitor C1 has a first terminal and a second terminal, wherein the first terminal is coupled to the second terminal of the current source I1, the second terminal is coupled to a reference ground. The switch S1 has a first terminal, a second terminal and a control terminal, wherein the first terminal is coupled to the first terminal of the capacitor C1, the second terminal is coupled to the reference ground. The error amplifier EA1 has a non-inverting input terminal, an inverting input terminal and an output terminal, wherein the non-inverting input terminal is configured to receive a reference voltage Vref1, the inverting input terminal is coupled to the first terminal of the capacitor C1. Based on the reference voltage Vref1 and the voltage Vc1 across the capacitor C1, the error amplifier EA1 generates a regulation voltage V1 at the output terminal. Typically, there is a compensation network consisting of capacitors coupled to the output terminal of the error amplifier EA1.

The comparator COM1 has a non-inverting input terminal, an inverting input terminal and an output terminal, wherein the non-inverting input terminal is coupled to the first terminal of the capacitor C1, the inverting input terminal is coupled to the output terminal of the error amplifier EA1. The comparator COM1 compares the voltage Vc1 across the capacitor C1 with the regulation voltage V1, and generates a comparison signal CO1 at the output terminal. The one-shot circuit 11 has an input terminal and an output terminal, wherein the input terminal is coupled to the output terminal of the comparator COM1, the output terminal is coupled to the control terminal of the switch S1. Based on the comparison signal CO1, the one-shot circuit 11 generates a trigger signal TRG at the output terminal.

Figure 1:
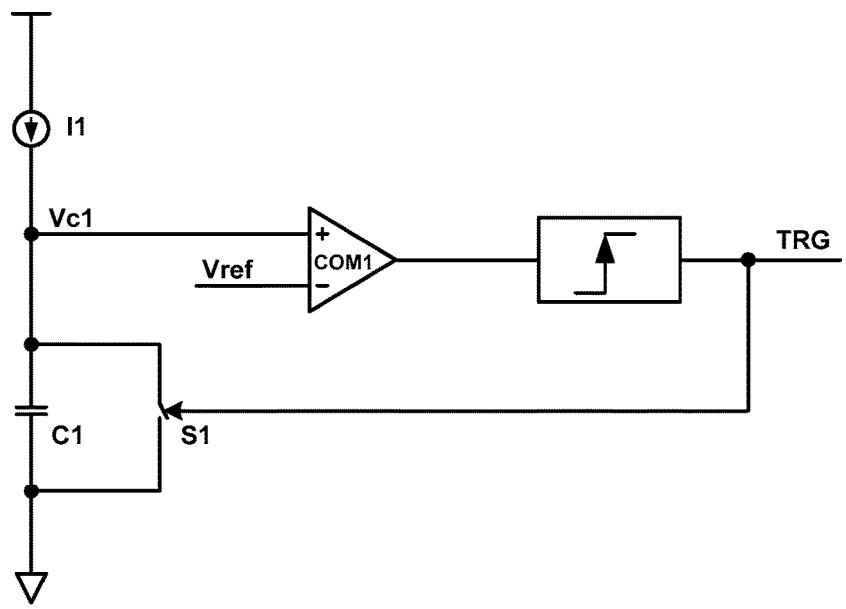
FIG. 1 schematically illustrates a traditional oscillator used in switching power supplies.
Figure 2:
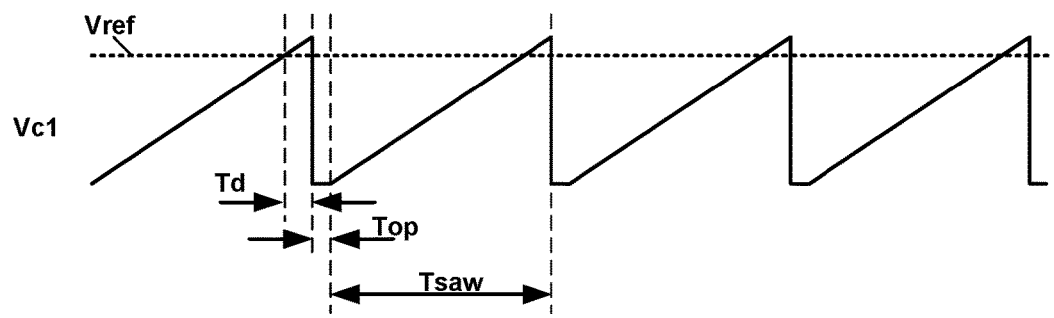
FIG. 2 provides working waveforms of the oscillator shown in FIG. 1.

In contrast with the prior art shown in FIG. 1, the oscillator 10 of FIG. 3 further incorporates an error amplifier EA1. And thanks to this error amplifier, on the occasion that the average value of the voltage Vc1 is higher than the reference voltage Vref1, the regulation voltage V1 will decrease to reduce the charge time Tsaw of the capacitor C1 and thus lower the average value, and vice versa. The average value of the voltage Vc1 thus is going to become finally equal to the reference voltage Vref1, and could be expressed as:

$$V_{c1(ave)} = \frac{0.5 * T_{saw} * V_{c1(peak)}}{T_{saw} + T_{op}} = V_{ref1} \quad (2)$$

Wherein Vc1 (peak) represents the peak value of the voltage Vc1.

The reference voltage Vref1 is normally set to be a half of the expected peak value Vref, which means:

$$V_{ref1} = 0.5 * V_{ref} \quad (3)$$

Therefore it can be gotten from equations (2) and (3) that:

$$V_{c1(peak)} = V_{ref} * \left(1 + \frac{T_{op}}{T_{saw}}\right) = \frac{I_1 * T_{saw}}{C_1} \quad (4)$$

Figure 4:
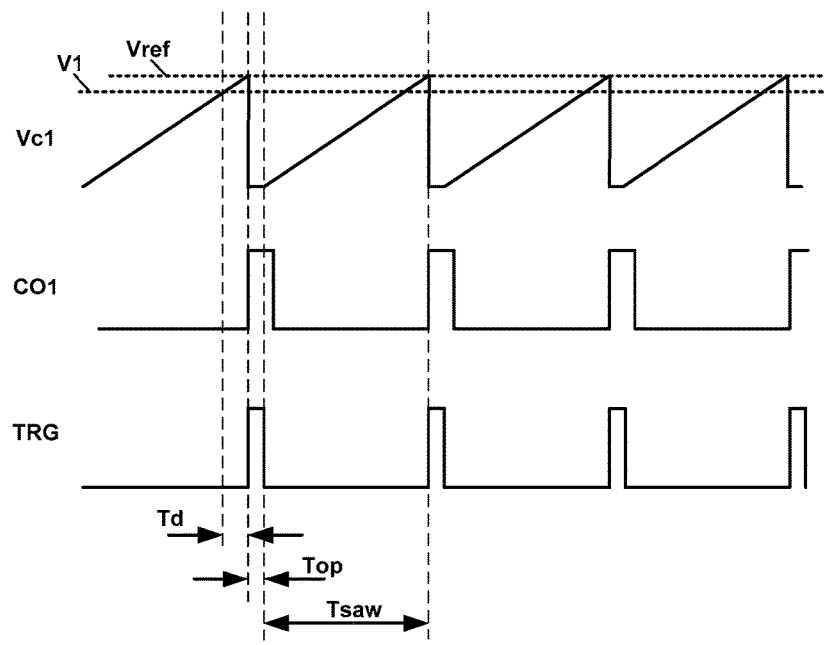
FIG. 4 illustrates working waveforms of the oscillator 10 shown in FIG. 3 in accordance with an embodiment of the present invention.

Since the pulse width Top of the pulse generated by the one-shot circuit 11 is typically very small (e.g. 10 nS), the peak value Vc1 (peak) is approximately equal to Vref, as shown in FIG. 4. The oscillating frequency f thus can be expressed as:

$$f = \frac{1}{T_{saw} + T_{op}} = \frac{1}{\frac{C_1 * V_{ref} + \sqrt{C_1^2 * V_{ref}^2 + 4 * I_1 * C_1 * V_{ref} * T_{op}}}{2 * I_1} + T_{op}} \quad (5)$$

As is apparent from equation (5), the frequency f is no longer influenced by the inherent delay Td of the comparator COM1.

Figure 5:
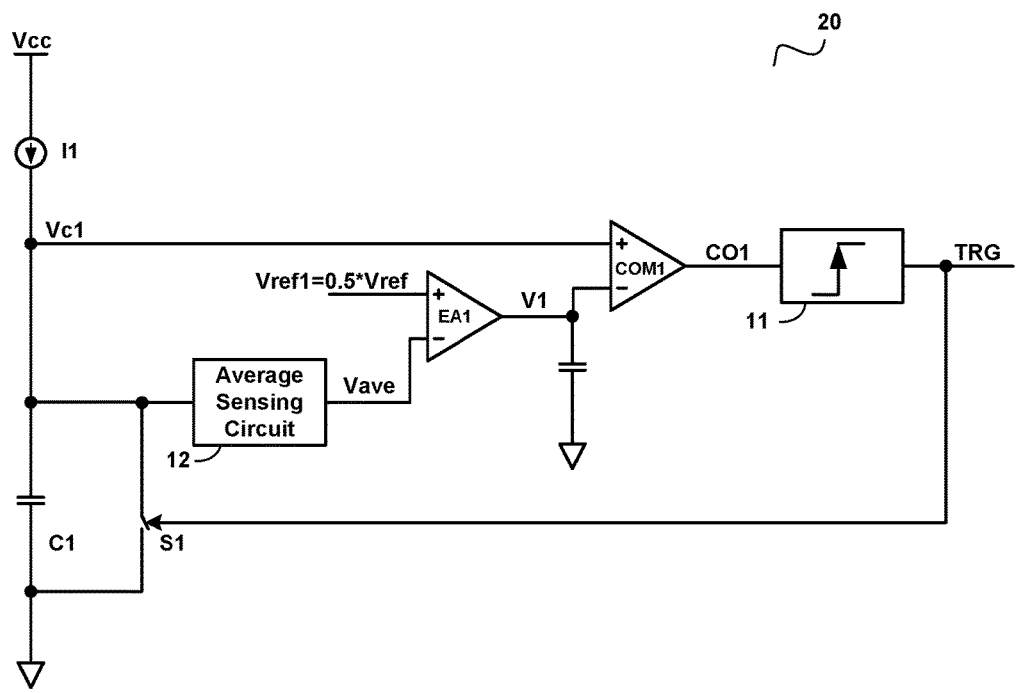
FIG. 5 schematically illustrates an oscillator 20 in accordance with an embodiment of the present invention.

FIG. 5 schematically illustrates an oscillator 20 in accordance with an embodiment of the present invention. Compared with that shown in FIG. 3, the oscillator 20 further involves an average sensing circuit 12 which has an input terminal and an output terminal, wherein the input terminal is coupled to the first terminal of the capacitor C1, the output terminal is coupled to the inverting input terminal of the error amplifier EA1. The average sensing circuit 12 senses the average value of the voltage Vc1, and generates an average signal Vave indicative of the average value at the output terminal. The error amplifier EA1 regulates the average signal Vave to be equal to the reference voltage Vref1, so the adverse effect caused by the inherent delay of the comparator COM1 could be removed. In some embodiments, the average sensing circuit 12 is a filter consisting of resistors and capacitors. Of course, it could also be configured in other suitable structure.

Figure 6A:
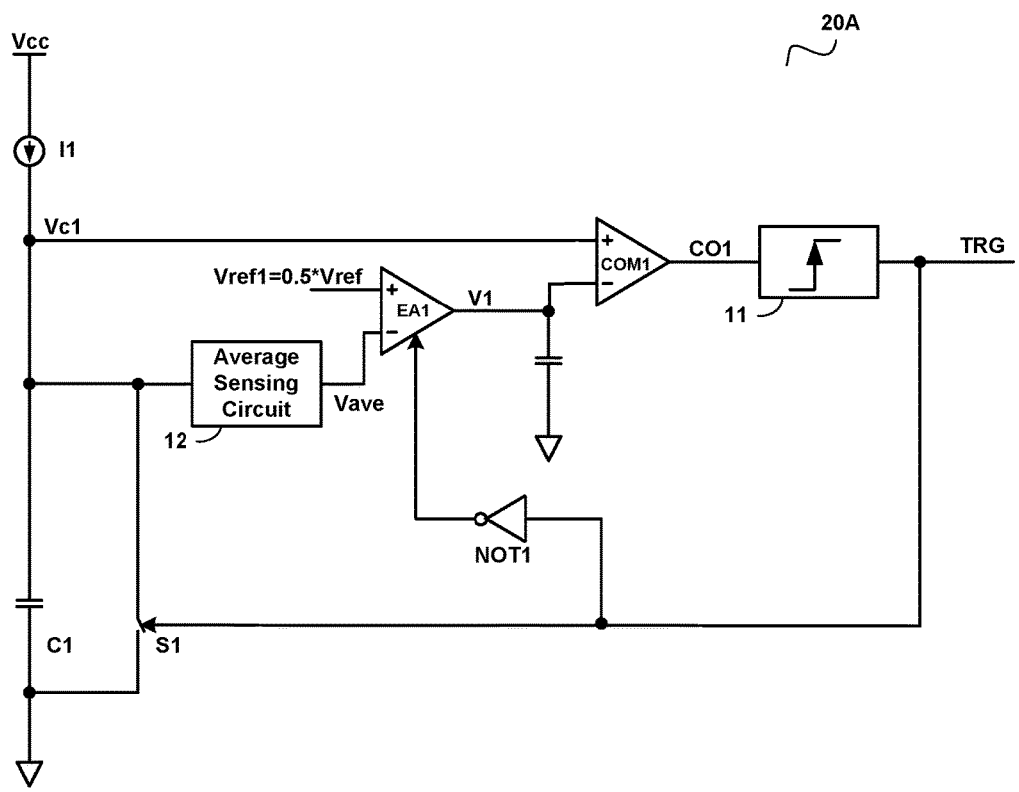
FIGS. 6A~6C respectively illustrate oscillators 20A~20C in accordance with different embodiments of the present invention.

FIG. 6A illustrates an oscillator 20A in accordance with an embodiment of the present invention. In this exemplary embodiment, the error amplifier EA1 further has an enable terminal which is controlled by the trigger signal TRG through a NOT gate NOT1. The error amplifier EA1 is disabled when the trigger signal TRG is logical high (during Top), and is enabled when the trigger signal TRG is logical low (during Tsaw). By doing so, the average value of the voltage Vc1 over Tsaw (rather than the entire period Tsaw+Top) is regulated to be equal to the reference voltage Vref1, which provides:

$$0.5 * V_{c1(peak)} = V_{ref1} \quad (6)$$

Based on equations (3) and (6), it can be gotten that:

$$V_{c1(peak)} = V_{ref} = \frac{I_1 * T_{saw}}{C_1} \quad (7)$$

And thus the frequency f could be expressed as:

$$f = \frac{1}{T_{saw} + T_{op}} = \frac{1}{\frac{C_1 * V_{ref}}{I_1} + T_{op}} \quad (8)$$

Obviously, this equation is much simpler than equation (5).

Figure 6B:
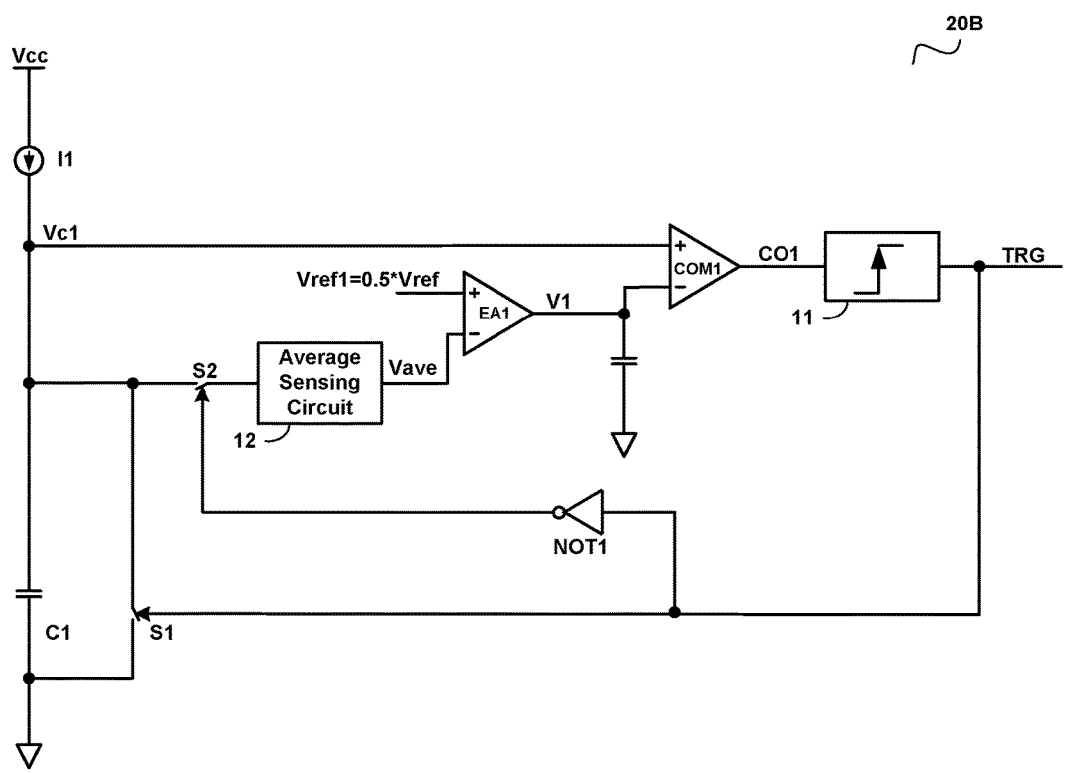
Figure 6C:
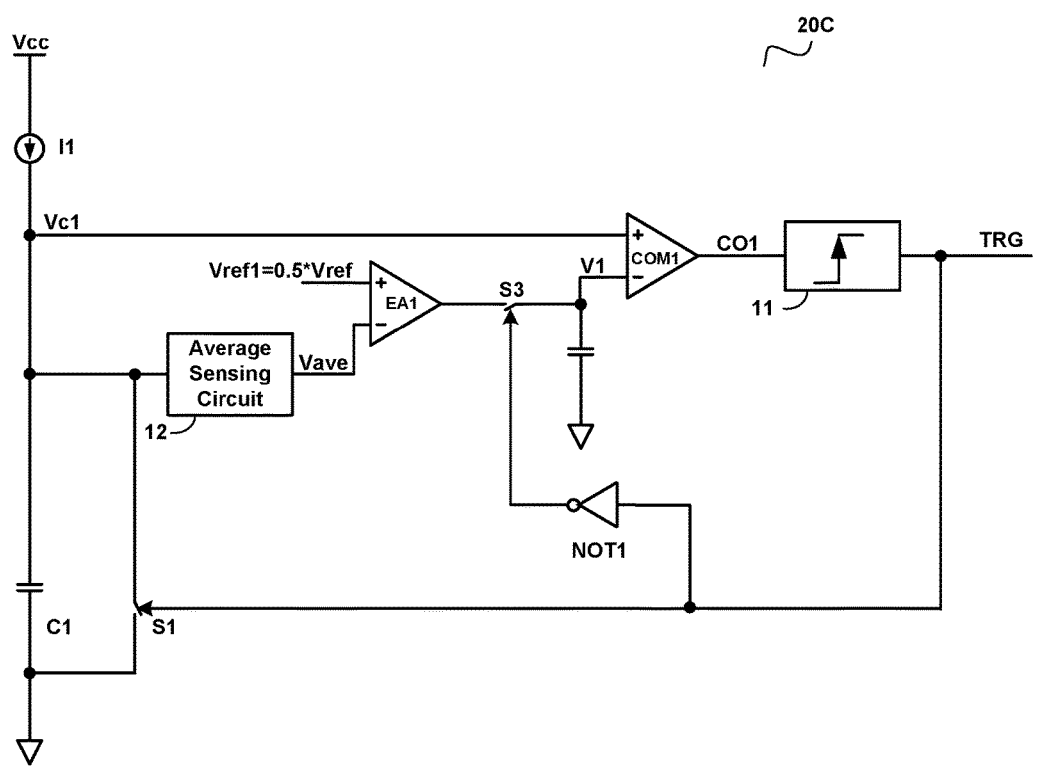

In the embodiment of FIG. 6A, the signal generated by the NOT gate NOT1 is provided to the enable terminal of the error amplifier EA1 to disable it within Top, so as to avoid the impact on the regulation voltage V1 caused by the voltage Vc1 during Top. People of ordinary skill in the art can recognize that, however, that this function could also be realized by either disconnecting the input terminal of the average sensing circuit 12 within Top via a switch S2 as shown in FIG. 6B, or disconnecting the output terminal of the error amplifier EA1 within Top via a switch S3 as shown in FIG. 6C. It could also be understood that the average sensing circuit 12 in FIGS. 6A~6C is not necessary and might be omitted.

Figure 7:
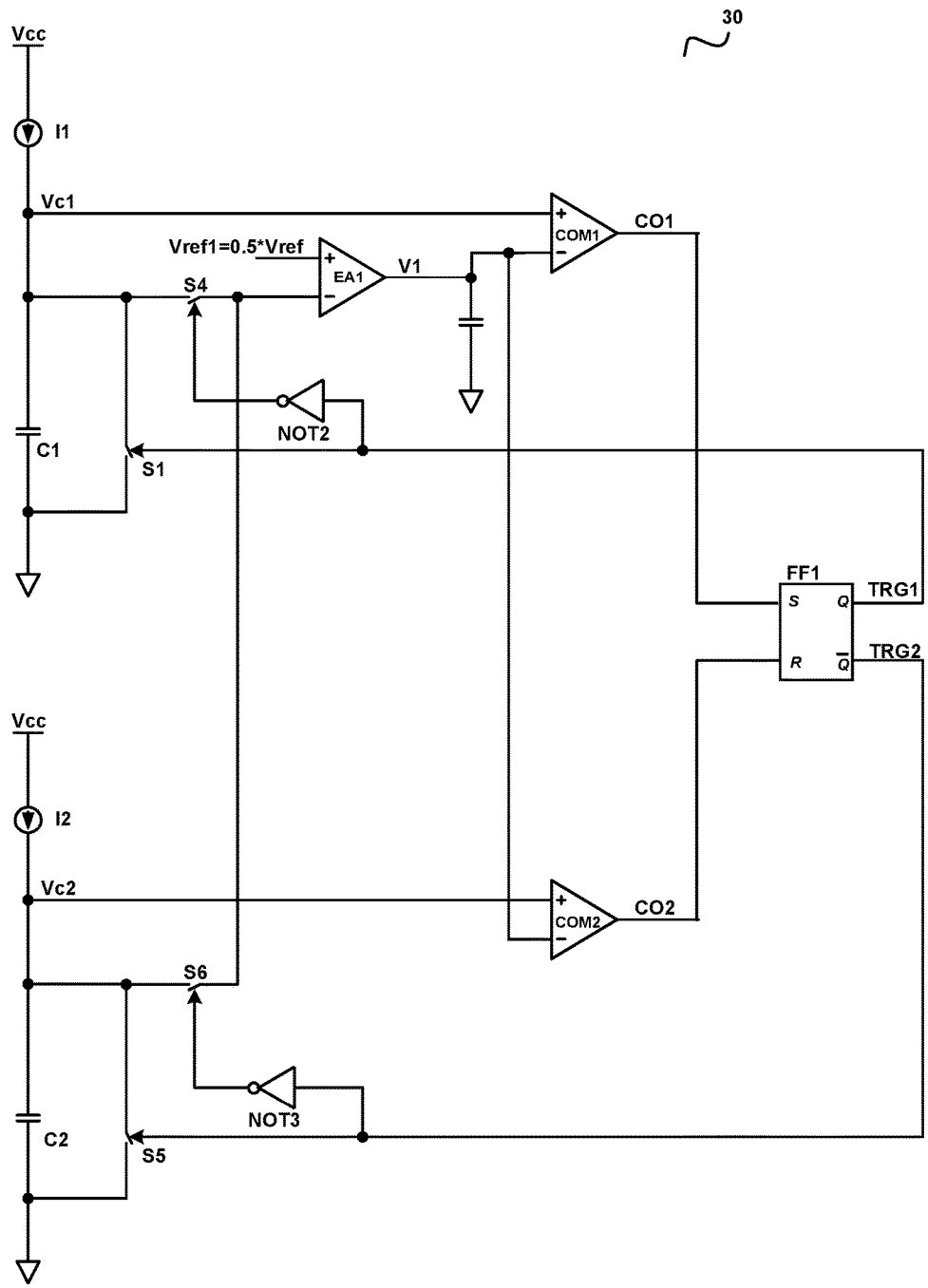
FIG. 7 schematically illustrates an oscillator 30 in accordance with an embodiment of the present invention.

FIG. 7 schematically illustrates an oscillator 30 in accordance with an embodiment of the present invention. The oscillator 30 contains current source 11, 12, capacitors C1, C2, switches S1, S4~S6, an error amplifier EA1, comparators COM1, COM2, NOT gates NOT2, NOT3 and a flip-flop FF1. The current source I1 has a first terminal and a second terminal, wherein the first terminal is coupled to a power supply voltage Vcc. The capacitor C1 has a first terminal and a second terminal, wherein the first terminal is coupled to the second terminal of the current source I1, the second terminal is coupled to a reference ground. The switch S1 has a first terminal, a second terminal and a control terminal, wherein the first terminal is coupled to the first terminal of the capacitor C1, the second terminal is coupled to the reference ground.

The current source I2 has a first terminal and a second terminal, wherein the first terminal is coupled to the power supply voltage Vcc. The capacitor C2 has a first terminal and a second terminal, wherein the first terminal is coupled to the second terminal of the current source I2, the second terminal is coupled to the reference ground. The switch S5 has a first terminal, a second terminal and a control terminal, wherein the first terminal is coupled to the first terminal of the capacitor C2, the second terminal is coupled to the reference ground.

The switch S4 has a first terminal, a second terminal and a control terminal, wherein the first terminal is coupled to the first terminal of the capacitor C1. The switch S6 has a first terminal, a second terminal and a control terminal, wherein the first terminal is coupled to the first terminal of the capacitor C2. The error amplifier EA1 has a non-inverting input terminal, an inverting input terminal and an output terminal, wherein the non-inverting input terminal is configured to receive a reference voltage Vref1, the inverting input terminal is coupled to the second terminals of the switches S4 and S6, and the output terminal provides a regulation voltage V1.

The comparator COM1 has a non-inverting input terminal, an inverting input terminal and an output terminal, wherein the non-inverting input terminal is coupled to the first terminal of the capacitor C1, the inverting input terminal is coupled to the output terminal of the error amplifier EA1. The comparator COM1 compares the voltage Vc1 across the capacitor C1 with the regulation voltage V1, and generates a comparison signal CO1 at the output terminal. The comparator COM2 has a non-inverting input terminal, an inverting input terminal and an output terminal, wherein the non-inverting input terminal is coupled to the first terminal of the capacitor C2, the inverting input terminal is coupled to the output terminal of the error amplifier EA1. The comparator COM2 compares the voltage Vc2 across the capacitor C2 with the regulation voltage V1, and generates a comparison signal CO2 at the output terminal.

The flip-flop FF1 has a set terminal S, a reset terminal R, a non-inverting output terminal Q and an inverting output terminal /Q, wherein the set terminal is coupled to the output terminal of the comparator COM1, the reset terminal is coupled to the output terminal of the comparator COM2, the non-inverting output terminal Q is coupled to the control terminal of the switch S1, the inverting output terminal is coupled to the control terminal of the switch S5. Based on the comparison signals CO1 and CO2, the flip-flop FF1 generates trigger signals TRG1 and TRG2 respectively at the output terminals Q and /Q.

The NOT gate NOT2 has an input terminal and an output terminal, wherein the input terminal is coupled to the non-inverting output terminal Q of the flip-flop FF1, the output terminal is coupled to the control terminal of the switch S4. The NOT gate NOT3 has an input terminal and an output terminal, wherein the input terminal is coupled to the inverting output terminal /Q of the flip-flop FF1, the output terminal is coupled to the control terminal of the switch S6.

Figure 8:
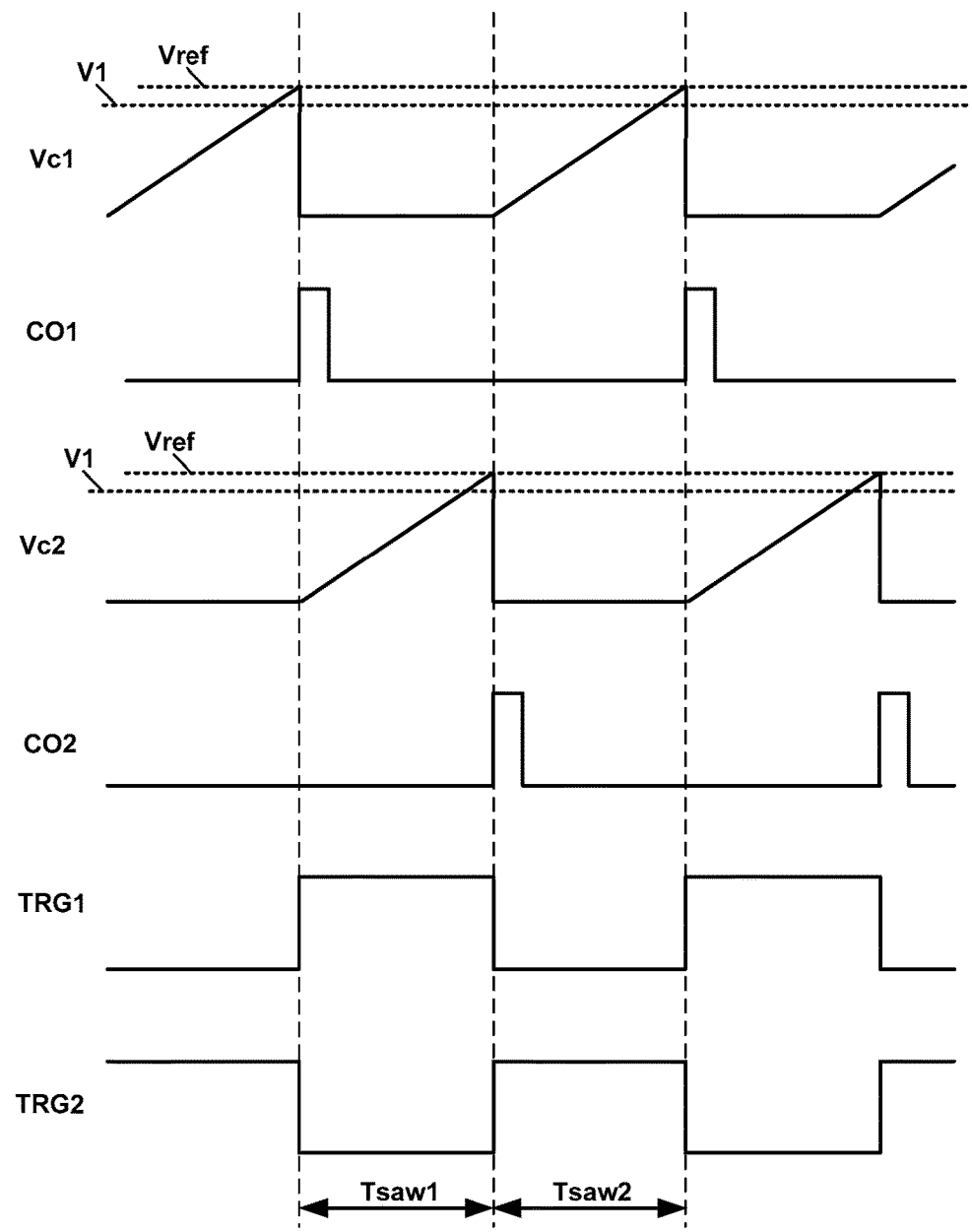
FIG. 8 illustrates working waveforms of the oscillator 30 shown in FIG. 7 in accordance with an embodiment of the present invention.

Working principle of the oscillator 30 will be briefly interpreted below with reference of waveforms shown in FIG. 8. The current source I1 charges the capacitor C1 when the switch S1 is off. When the voltage Vc1 across the capacitor C1 increases to reach the regulation voltage V1, the comparison signal CO1 transits from logical low into logical high. The flip-flop FF1 is set and the trigger signal TRG1 changes from logical low into logical high. The switch S1 is therefore turned on to discharge the capacitor C1. At the same time, the trigger signal TRG2 changes from logical high into logical low. The switch S5 turns off and the current source I2 starts to charge the capacitor C2. When the voltage Vc2 across the capacitor C2 increases to hit the regulation voltage V1, the comparison signal CO2 transits from logical low into logical high. The flip-flop FF1 is reset and the trigger signal TRG2 changes from logical low into logical high. The switch S5 is therefore turned on to discharge the capacitor C2. At the same time, the trigger signal TRG1 changes from logical high into logical low to turn off the switch S1. And the current source I1 resumes charging the capacitor C1.

Thanks to the error amplifier EA1, the average value of the voltage Vc1 and Vc2 during its corresponding charge time (Tsaw2, Tsaw1) are both regulated to be equal to the reference voltage Vref1, which provides:

$$V_{c1(ave)}=V_{c2(ave)}=0.5*V_{c1(peak)}=0.5*V_{c2(peak)}=V_{ref1} \quad (9)$$

It can be gained from equations (3) and (9) that:

$$V_{c1(peak)}=V_{c2(peak)}=V_{ref} \quad (10)$$

As a result, the oscillating frequency f could be expressed as:

$$f = \frac{1}{T_{saw1}+T_{saw2}} = \frac{1}{\frac{C_1*V_{ref}}{I_1}+\frac{C_2*V_{ref}}{I_2}} \quad (11)$$

As can be seen from equation (11), the effect caused by the intrinsic delay of the comparator has been eliminated. Furthermore, the frequency f is no longer affected by Top since there does not exist any one-shot circuit in the embodiment shown in FIG. 7.

Figure 9:
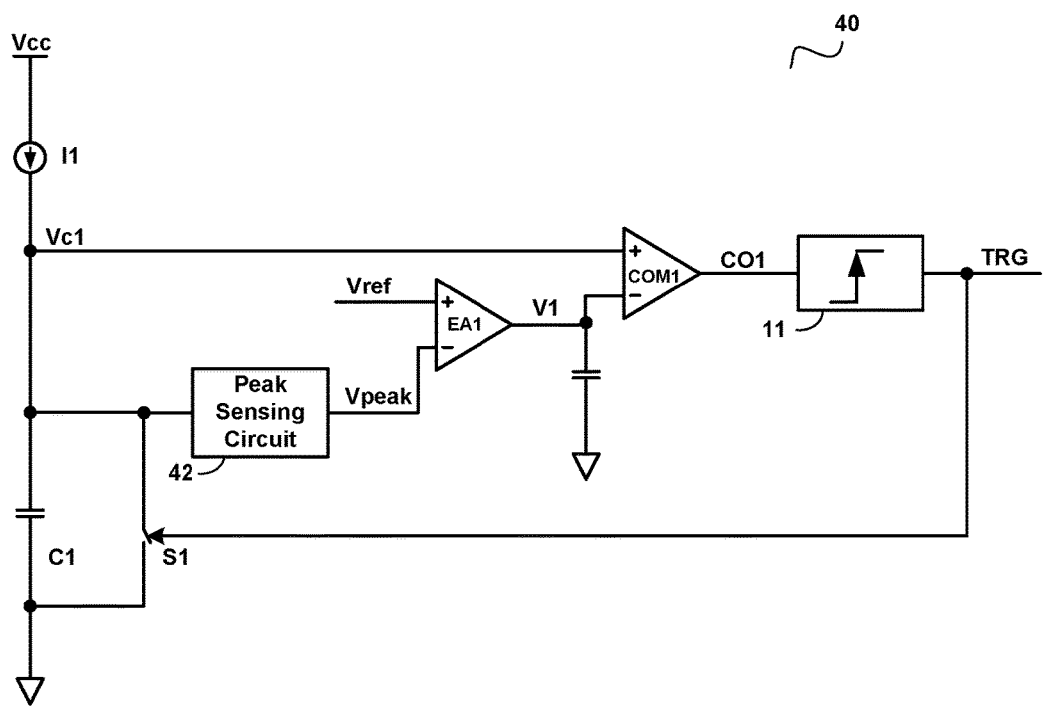
FIG. 9 schematically illustrates an oscillator 40 in accordance with an embodiment of the present invention.

Although the average value of the voltage across the capacitor is regulated in the embodiments demonstrated above, this is not utilized to limit the invention and a regulation of the peak value of the capacitor voltage is also feasible. FIG. 9 schematically illustrates an oscillator 40 in accordance with an embodiment of the present invention. Compared with the circuit shown in FIG. 3, the oscillator 40 further contains a peak sensing circuit 42 which has an input terminal and an output terminal, wherein the input terminal is coupled to the first terminal of the capacitor C1, the output terminal is coupled to the inverting input terminal of the error amplifier EA1. The peak sensing circuit 42 senses the peak value of the voltage Vc1 across the capacitor C1, and generates a peak signal Vpeak indicative of the peak value at the output terminal. In virtue of the error amplifier EA1, the peak signal Vpeak is regulated to be equal to the reference voltage Vref. The oscillating frequency f here could also be expressed as equation (8).

Figure 10:
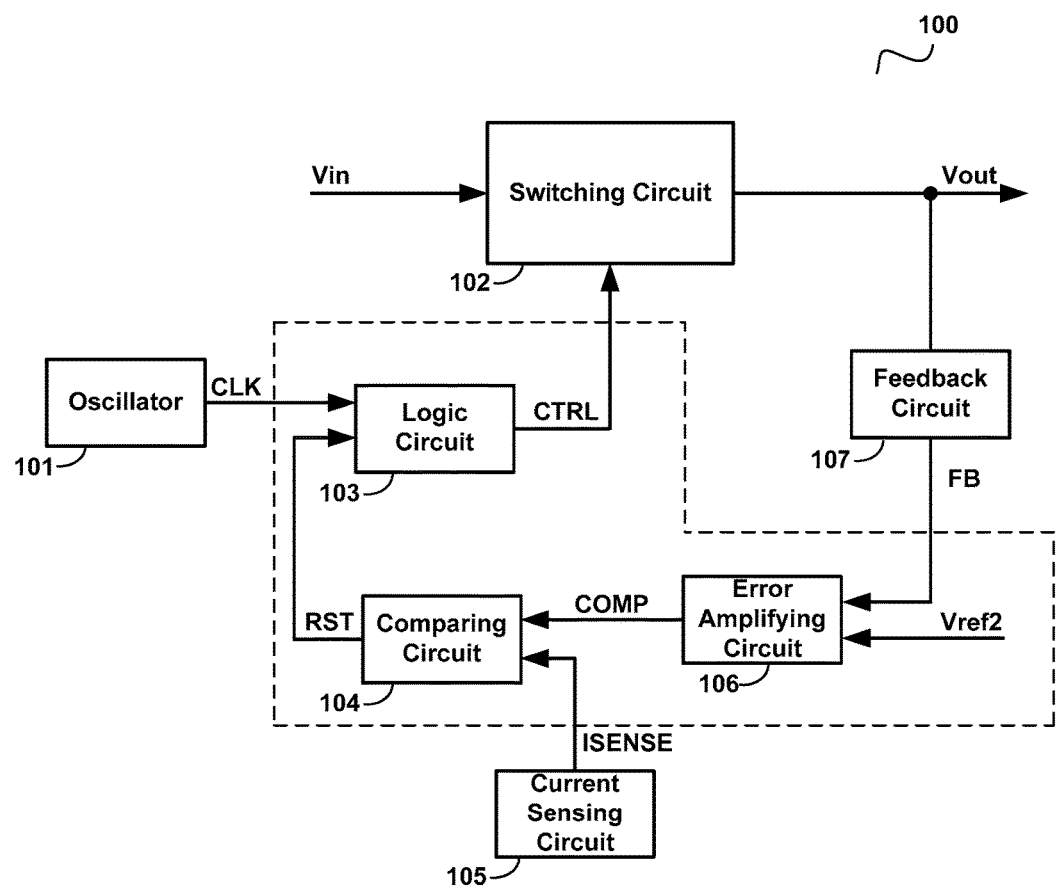
FIG. 10 schematically illustrates a switching power supply 100 in accordance with an embodiment of the present invention.

Oscillators described above could be widely utilized in electronic apparatuses, such as switching power supplies, to provide clock signals. FIG. 10 schematically illustrates a switching power supply 100 in accordance with an embodiment of the present invention. It includes an oscillator 101, a switching circuit 102, a logic circuit 103, a comparing circuit 104, a current sensing circuit 105, an error amplifying circuit 106 and a feedback circuit 107. The oscillator 101 could be configured as any embodiment described previously. And the clock signal CLK provided by the oscillator 101 might be chosen from any of the comparison signals (CO1, CO2) and trigger signals (TRG, TRG1, TRG2). The switching circuit 102 has a main switch and is configured to converts an input voltage Vin into an output voltage Vout. The switching circuit 102 could be configured in any suitable topology, such as Buck, Boost, Buck-Boost, Flyback, etc.

The feedback circuit 107 is coupled to the switching circuit 102, and is configured to sense the output voltage Vout and generate a feedback signal FB accordingly. The current sensing circuit 105 senses the current flowing through the main switch and generates a current sensing signal ISENSE. The error amplifying circuit 106 is coupled to the feedback circuit 107, and is configured to generate a comparison signal COMP based on the difference between the reference voltage Vref2 and the feedback signal FB. The comparing circuit 104 is coupled to the current sensing circuit 105 and the error amplifying circuit 106, and is configured to compare the compensation signal COMP with the current sensing signal ISENSE and generate a reset signal RST. The logic circuit 103 is coupled to the oscillator 101 and the comparing circuit 104, wherein based on the clock signal CLK and the reset signal RST, the logic circuit 103 generates a control signal CTRL to control the main switch.

Despite the fact that the switching power supply 100 of FIG. 10 utilizes a fixed frequency peak current control scheme, it should be understood that this does not construct a limitation to the present invention. The current sensing circuit 105 used therein is not essential, and the feedback circuit 107 could also sense output signals such as output current and output power, rather than the output voltage Vout. In addition, the logic circuit 103, comparing circuit 104 and error amplifying circuit 106 can also be replaced by other control circuits as long as the control signal CTRL for controlling the main switch can be provided according to the clock signal CLK and the feedback signal FB.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. An oscillator comprising:
   a current source having a first terminal and a second terminal, wherein the first terminal is coupled to a power supply voltage;
   a capacitor having a first terminal and a second terminal, wherein the first terminal is coupled to the second terminal of the current source, the second terminal is coupled to a reference ground;
   a first switch having a first terminal, a second terminal and a control terminal, wherein the first terminal is coupled to the first terminal of the capacitor, the second terminal is coupled to the reference ground;
   an error amplifier having a first input terminal, a second input terminal and an output terminal, wherein the first input terminal is configured to receive a reference voltage, the second input terminal is coupled to the first terminal of the capacitor, and wherein based on the reference voltage and the voltage across the capacitor, the error amplifier generates a regulation voltage at the output terminal;
   a comparator having a first input terminal, a second input terminal and an output terminal, wherein the first input terminal is coupled to the first terminal of the capacitor, the second input terminal is coupled to the output terminal of the error amplifier, and wherein the comparator compares the voltage across the capacitor with the regulation voltage, and generates a comparison signal at the output terminal; and
   a one-shot circuit having an input terminal and an output terminal, wherein the input terminal is coupled to the output terminal of the comparator, the output terminal is coupled to the control terminal of the first switch, and wherein based on the comparison signal, the one-shot circuit generates a trigger signal at the output terminal;
   wherein the error amplifier further has an enable terminal, and wherein the oscillator further comprises:
   a NOT gate having an input terminal and an output terminal, wherein the input terminal is coupled to the output terminal of the one-shot circuit, the output terminal is coupled to the enable terminal of the error amplifier.

2. An oscillator comprising:
   a current source having a first terminal and a second terminal, wherein the first terminal is coupled to a power supply voltage;
   a capacitor having a first terminal and a second terminal, wherein the first terminal is coupled to the second terminal of the current source, the second terminal is coupled to a reference ground;
   a first switch having a first terminal, a second terminal and a control terminal, wherein the first terminal is coupled to the first terminal of the capacitor, the second terminal is coupled to the reference ground;
   an error amplifier having a first input terminal, a second input terminal and an output terminal, wherein the first input terminal is configured to receive a reference voltage, the second input terminal is coupled to the first terminal of the capacitor, and wherein based on the reference voltage and the voltage across the capacitor, the error amplifier generates a regulation voltage at the output terminal;
   a comparator having a first input terminal, a second input terminal and an output terminal, wherein the first input terminal is coupled to the first terminal of the capacitor, the second input terminal is coupled to the output terminal of the error amplifier, and wherein the comparator compares the voltage across the capacitor with the regulation voltage, and generates a comparison signal at the output terminal;
   a one-shot circuit having an input terminal and an output terminal, wherein the input terminal is coupled to the output terminal of the comparator, the output terminal is coupled to the control terminal of the first switch, and wherein based on the comparison signal, the one-shot circuit generates a trigger signal at the output terminal;
   a second switch having a first terminal, a second terminal and a control terminal, wherein the first terminal is coupled to the first terminal of the capacitor, the second terminal is coupled to the second input terminal of the error amplifier; and a NOT gate having an input terminal and an output terminal, wherein the input terminal is coupled to the output terminal of the one-shot circuit, the output terminal is coupled to the control terminal of the second switch.

3. An oscillator comprising:

a current source having a first terminal and a second terminal, wherein the first terminal is coupled to a power supply voltage;

a capacitor having a first terminal and a second terminal, wherein the first terminal is coupled to the second terminal of the current source, the second terminal is coupled to a reference ground;

a first switch having a first terminal, a second terminal and a control terminal, wherein the first terminal is coupled to the first terminal of the capacitor, the second terminal is coupled to the reference ground;

an error amplifier having a first input terminal, a second input terminal and an output terminal, wherein the first input terminal is configured to receive a reference voltage, the second input terminal is coupled to the first terminal of the capacitor, and wherein based on the reference voltage and the voltage across the capacitor, the error amplifier generates a regulation voltage at the output terminal;

a comparator having a first input terminal, a second input terminal and an output terminal, wherein the first input terminal is coupled to the first terminal of the capacitor, the second input terminal is coupled to the output terminal of the error amplifier, and wherein the comparator compares the voltage across the capacitor with the regulation voltage, and generates a comparison signal at the output terminal;

a one-shot circuit having an input terminal and an output terminal, wherein the input terminal is coupled to the output terminal of the comparator, the output terminal is coupled to the control terminal of the first switch, and wherein based on the comparison signal, the one-shot circuit generates a trigger signal at the output terminal;

a third switch having a first terminal, a second terminal and a control terminal, wherein the first terminal is coupled to the output terminal of the error amplifier, the second terminal is coupled to the second input terminal of the comparator; and a NOT gate having an input terminal and an output terminal, wherein the input terminal is coupled to the output terminal of the one-shot circuit, the output terminal is coupled to the control terminal of the third switch.

4. An oscillator comprising:

a current source having a first terminal and a second terminal, wherein the first terminal is coupled to a power supply voltage;

a capacitor having a first terminal and a second terminal, wherein the first terminal is coupled to the second terminal of the current source, the second terminal is coupled to a reference ground;

a first switch having a first terminal, a second terminal and a control terminal, wherein the first terminal is coupled to the first terminal of the capacitor, the second terminal is coupled to the reference ground;

an error amplifier having a first input terminal, a second input terminal and an output terminal, wherein the first input terminal is configured to receive a reference voltage, the second input terminal is coupled to the first terminal of the capacitor, and wherein based on the reference voltage and the voltage across the capacitor, the error amplifier generates a regulation voltage at the output terminal;

a comparator having a first input terminal, a second input terminal and an output terminal, wherein the first input terminal is coupled to the first terminal of the capacitor, the second input terminal is coupled to the output terminal of the error amplifier, and wherein the comparator compares the voltage across the capacitor with the regulation voltage, and generates a comparison signal at the output terminal;

a one-shot circuit having an input terminal and an output terminal, wherein the input terminal is coupled to the output terminal of the comparator, the output terminal is coupled to the control terminal of the first switch, and wherein based on the comparison signal, the one-shot circuit generates a trigger signal at the output terminal;

an average sensing circuit having an input terminal and an output terminal, wherein the input terminal is coupled to the first terminal of the capacitor, the output terminal is coupled to the second input terminal of the error amplifier, and wherein the average sensing circuit senses the average value of the voltage across the capacitor, and generates an average signal indicative of the average value at the output terminal.

5. An oscillator comprising:

a current source having a first terminal and a second terminal, wherein the first terminal is coupled to a power supply voltage;

a capacitor having a first terminal and a second terminal, wherein the first terminal is coupled to the second terminal of the current source, the second terminal is coupled to a reference ground;

a first switch having a first terminal, a second terminal and a control terminal, wherein the first terminal is coupled to the first terminal of the capacitor, the second terminal is coupled to the reference ground;

an error amplifier having a first input terminal, a second input terminal and an output terminal, wherein the first input terminal is configured to receive a reference voltage, the second input terminal is coupled to the first terminal of the capacitor, and wherein based on the reference voltage and the voltage across the capacitor, the error amplifier generates a regulation voltage at the output terminal;

a comparator having a first input terminal, a second input terminal and an output terminal, wherein the first input terminal is coupled to the first terminal of the capacitor, the second input terminal is coupled to the output terminal of the error amplifier, and wherein the comparator compares the voltage across the capacitor with the regulation voltage, and generates a comparison signal at the output terminal;

a one-shot circuit having an input terminal and an output terminal, wherein the input terminal is coupled to the output terminal of the comparator, the output terminal is coupled to the control terminal of the first switch, and wherein based on the comparison signal, the one-shot circuit generates a trigger signal at the output terminal;

a peak sensing circuit having an input terminal and an output terminal, wherein the input terminal is coupled to the first terminal of the capacitor, the output terminal is coupled to the second input terminal of the error amplifier, and wherein the peak sensing circuit senses the peak value of the voltage across the capacitor, and generates a peak signal indicative of the peak value at the output terminal.

6. An oscillator comprising:
a first current source having a first terminal and a second terminal, wherein the first terminal is coupled to a power supply voltage;
a first capacitor having a first terminal and a second terminal, wherein the first terminal is coupled to the second terminal of the first current source, the second terminal is coupled to a reference ground;
a first switch having a first terminal, a second terminal and a control terminal, wherein the first terminal is coupled to the first terminal of the first capacitor, the second terminal is coupled to the reference ground;
a second current source having a first terminal and a second terminal, wherein the first terminal is coupled to the power supply voltage;
a second capacitor having a first terminal and a second terminal, wherein the first terminal is coupled to the second terminal of the second current source, the second terminal is coupled to the reference ground;
a second switch having a first terminal, a second terminal and a control terminal, wherein the first terminal is coupled to the first terminal of the second capacitor, the second terminal is coupled to the reference ground;
a third switch having a first terminal, a second terminal and a control terminal, wherein the first terminal is coupled to the first terminal of the first capacitor;
a fourth switch having a first terminal, a second terminal and a control terminal, wherein the first terminal is coupled to the first terminal of the second capacitor;
an error amplifier having a first input terminal, a second input terminal and an output terminal, wherein the first input terminal is configured to receive a reference voltage, the second input terminal is coupled to the second terminals of the third and fourth switches, and the output terminal provides a regulation voltage;
a first comparator having a first input terminal, a second input terminal and an output terminal, wherein the first input terminal is coupled to the first terminal of the first capacitor, the second input terminal is coupled to the output terminal of the error amplifier, and wherein the first comparator compares the voltage across the first capacitor with the regulation voltage, and generates a first comparison signal at the output terminal;
a second comparator having a first input terminal, a second input terminal and an output terminal, wherein the first input terminal is coupled to the first terminal of the second capacitor, the second input terminal is coupled to the output terminal of the error amplifier, and wherein the second comparator compares the voltage across the second capacitor with the regulation voltage, and generates a second comparison signal at the output terminal;
a flip-flop having a first input terminal, a second input terminal, a first output terminal and a second output terminal, wherein the first input terminal is coupled to the output terminal of the first comparator, the second input terminal is coupled to the output terminal of the second comparator, the first output terminal is coupled to the control terminal of the first switch, the second output terminal is coupled to the control terminal of the second switch, wherein based on the first and second comparison signals, the flip-flop generates a first trigger signal and a second trigger signal respectively at the first and second output terminals;
a first NOT gate having an input terminal and an output terminal, wherein the input terminal is coupled to the first output terminal of the flip-flop, the output terminal is coupled to the control terminal of the third switch; and
a second NOT gate having an input terminal and an output terminal, wherein the input terminal is coupled to the second output terminal of the flip-flop, the output terminal is coupled to the control terminal of the fourth switch.

7. The oscillator of claim 6, further comprising:
an average sensing circuit having an input terminal and an output terminal, wherein the input terminal is coupled to the second terminals of the third and fourth switches, the output terminal is coupled to the second input terminal of the error amplifier.

8. The oscillator of claim 6, further comprising:
a peak sensing circuit having an input terminal and an output terminal, wherein the input terminal is coupled to the second terminals of the third and fourth switches, the output terminal is coupled to the second input terminal of the error amplifier.

9. A controller used in a switching power supply, comprising:
an oscillator including:
    a current source having a first terminal and a second terminal, wherein the first terminal is coupled to a power supply voltage;
    a capacitor having a first terminal and a second terminal, wherein the first terminal is coupled to the second terminal of the current source, the second terminal is coupled to a reference ground;
    a first switch having a first terminal, a second terminal and a control terminal, wherein the first terminal is coupled to the first terminal of the capacitor, the second terminal is coupled to the reference ground;
    an error amplifier having a first input terminal, a second input terminal and an output terminal, wherein the first input terminal is configured to receive a first reference voltage, the second input terminal is coupled to the first terminal of the capacitor, and wherein based on the first reference voltage and the voltage across the capacitor, the error amplifier generates a regulation voltage at the output terminal;
    a comparator having a first input terminal, a second input terminal and an output terminal, wherein the first input terminal is coupled to the first terminal of the capacitor, the second input terminal is coupled to the output terminal of the error amplifier, and wherein the comparator compares the voltage across the capacitor with the regulation voltage, and generates a comparison signal at the output terminal; and
    a one-shot circuit having an input terminal and an output terminal, wherein the input terminal is coupled to the output terminal of the comparator, the output terminal is coupled to the control terminal of the first switch, and wherein based on the comparison signal, the one-shot circuit generates a trigger signal at the output terminal; and
a control circuit coupled to the oscillator, wherein based on a clock signal generated by the oscillator and a feedback signal indicative of an output signal of the switching power supply, the control circuit generates a control signal to control a main switch in the switching power supply, and wherein the clock signal is either the comparison signal or the trigger signal.

10. The controller of claim 9, wherein the error amplifier is disabled when the first switch is on.

11. The controller of claim 9, wherein the error amplifier further has an enable terminal, and wherein the oscillator further includes:
- a NOT gate having an input terminal and an output terminal, wherein the input terminal is coupled to the output terminal of the one-shot circuit, the output terminal is coupled to the enable terminal of the error amplifier.

12. The controller of claim 9, wherein the oscillator further includes:
- a second switch having a first terminal, a second terminal and a control terminal, wherein the first terminal is coupled to the first terminal of the capacitor, the second terminal is coupled to the second input terminal of the error amplifier; and
- a NOT gate having an input terminal and an output terminal, wherein the input terminal is coupled to the output terminal of the one-shot circuit, the output terminal is coupled to the control terminal of the second switch.

13. The controller of claim 9, wherein the oscillator further includes:
- a third switch having a first terminal, a second terminal and a control terminal, wherein the first terminal is coupled to the output terminal of the error amplifier, the second terminal is coupled to the second input terminal of the comparator; and
- a NOT gate having an input terminal and an output terminal, wherein the input terminal is coupled to the output terminal of the one-shot circuit, the output terminal is coupled to the control terminal of the third switch.

14. The controller of claim 9, wherein the oscillator further includes:
- an average sensing circuit having an input terminal and an output terminal, wherein the input terminal is coupled to the first terminal of the capacitor, the output terminal is coupled to the second input terminal of the error amplifier, and wherein the average sensing circuit senses the average value of the voltage across the capacitor, and generates an average signal indicative of the average value at the output terminal.

15. The controller of claim 9, wherein the oscillator further includes:
- a peak sensing circuit having an input terminal and an output terminal, wherein the input terminal is coupled to the first terminal of the capacitor, the output terminal is coupled to the second input terminal of the error amplifier, and wherein the peak sensing circuit senses the peak value of the voltage across the capacitor, and generates a peak signal indicative of the peak value at the output terminal.

16. The controller of claim 9, wherein the control circuit comprises:
- an error amplifying circuit having a first input terminal, a second input terminal and an output terminal, wherein the first input terminal is configured to receive the feedback signal, the second input terminal is configured to receive a second reference voltage, and wherein based on the feedback signal and the second reference voltage, the error amplifying circuit generates a compensation signal at the output terminal;
- a comparing circuit having a first input terminal, a second input terminal and an output terminal, wherein the first input terminal is coupled to the output terminal of the error amplifying circuit, the second input terminal is configured to receive a current sensing signal indicative of the current flowing through the main switch, and wherein the comparing circuit compares the compensation signal with the current sensing signal, and generates a reset signal at the output terminal; and
- a logic circuit having a first input terminal, a second input terminal and an output terminal, wherein the first input terminal is coupled to the oscillator to receive the clock signal, the second input terminal is coupled to the output terminal of the comparing circuit, and wherein based on the clock signal and the reset signal, the logic circuit generates the control signal at the output terminal.

* * * * *